United States Patent
Huelsewede et al.

(10) Patent No.: US 11,552,453 B2
(45) Date of Patent: Jan. 10, 2023

(54) METHOD FOR PRODUCING A DIODE LASER AND DIODE LASER

(71) Applicant: JENOPTIK Laser GmbH, Jena (DE)

(72) Inventors: Ralf Huelsewede, Koenigs Wusterhausen (DE); Matthias Schroeder, Weimar (DE); Valentin Loyo Maldonado, Jena (DE)

(73) Assignee: Jenoptik Laser GmbH, Jena (DE)

( * ) Notice: Subject to any disclaimer, the term of this patent is extended or adjusted under 35 U.S.C. 154(b) by 316 days.

(21) Appl. No.: 15/553,370

(22) PCT Filed: Feb. 24, 2016

(86) PCT No.: PCT/EP2016/053802
§ 371 (c)(1),
(2) Date: Aug. 24, 2017

(87) PCT Pub. No.: WO2016/135160
PCT Pub. Date: Sep. 1, 2016

(65) Prior Publication Data
US 2018/0138664 A1    May 17, 2018

(30) Foreign Application Priority Data
Feb. 24, 2015    (DE) .......................... 102015002176.1

(51) Int. Cl.
*H01S 5/40* (2006.01)
*H01S 5/02355* (2021.01)
(Continued)

(52) U.S. Cl.
CPC .......... *H01S 5/4025* (2013.01); *H01S 5/0234* (2021.01); *H01S 5/02355* (2021.01); *H01S 5/02365* (2021.01); *H01S 5/02476* (2013.01)

(58) Field of Classification Search
CPC ............ H01S 5/02256; H01S 5/02264; H01S 5/02476; H01S 5/4025–4093; H01S 5/02355–0237; H01L 2224/29019
See application file for complete search history.

(56) References Cited

U.S. PATENT DOCUMENTS 4,716,568 A    12/1987 Scifres et al.
5,105,429 A    4/1992 Mundinger et al.
(Continued)

FOREIGN PATENT DOCUMENTS

EP    2053709 A1    4/2009
JP    2002314011 A    10/2002
(Continued)

OTHER PUBLICATIONS

English Translation of the International Prelminary Report on Patentability dated Sep. 8, 2017.

*Primary Examiner* — Sean P Hagan
(74) *Attorney, Agent, or Firm* — Muncy, Geissler, Olds & Lowe, P.C.

(57) ABSTRACT

A method for the production of a diode laser having a laser bar, wherein a metal layer having raised areas is used which is located between the n-side of the laser bar and the cover. The metal layer can be plastically deformed during installation without volume compression in the solid physical state. As a result the laser module can be reliably installed and a slight deviation (smile value) of the emitters from a centre line is achieved.

17 Claims, 8 Drawing Sheets

(51) Int. Cl.
      *H01S 5/02365*   (2021.01)
      *H01S 5/024*   (2006.01)
      *H01S 5/0234*   (2021.01)

(56) References Cited

U.S. PATENT DOCUMENTS

| | | | |
|---|---|---|---|
| 6,754,244 | B2 | 6/2004 | Roellig et al. |
| 9,631,781 | B2 | 4/2017 | Ide et al. |
| 2006/0029117 | A1 | 2/2006 | Valiente |
| 2009/0104727 | A1* | 4/2009 | Krejci ................. H01S 5/02492 438/46 |
| 2011/0142087 | A1 | 6/2011 | Schroeder et al. |
| 2012/0234458 | A1* | 9/2012 | Yoda ....................... H01L 24/83 156/64 |
| 2012/0252144 | A1 | 10/2012 | Schroeder et al. |

FOREIGN PATENT DOCUMENTS

| | | |
|---|---|---|
| JP | 2003086883 A | 3/2003 |
| WO | WO 2009/143835 A2 | 12/2009 |
| WO | WO 2009/146683 A2 | 12/2009 |
| WO | WO 2011/029846 A1 | 3/2011 |
| WO | WO2013069743 A1 | 4/2015 |

\* cited by examiner

METHOD FOR PRODUCING A DIODE LASER AND DIODE LASER

This application is a National Stage of International Application No. PCT/EP2016/053802, filed on Feb. 24, 2016, which claims priority to German Application No. DE 102015002176.1 filed in Germany on Feb. 24, 2015, the entire contents of all of which are hereby incorporated by reference.

TECHNICAL FIELD

The invention relates to a method for producing a diode laser and to a diode laser. The diode laser comprises a laser bar, which is arranged between a heat conducting body and a cover. The heat conducting body and the cover serve as electrical contacts, through which the operating current is passed to the laser bar.

PRIOR ART

Methods for producing a diode laser in which a laser bar is soldered on the p side onto a heat sink and contacted on the n side by way of bonding wires have long been known, for example from U.S. Pat. Nos. 5,105,429 A and 4,716,568 A. The limited current-carrying capability of the bonding wires is disadvantageous.

A higher current-carrying capability of the n-side current terminal can be achieved by the use of a solid cover, which may be formed as a second heat conducting body. It is known from WO 2009143835 and from WO 2009146683 to solder the laser bar on between two heat conducting bodies. The soldering process may lead to stresses in the laser bar, which can impair the electrooptical properties. WO 2011029846 discloses a method for producing a diode laser without the involvement of a soldering process, in which a first metal layer is used between the first contact area of the laser bar and the first heat conducting body and a second metal layer is used between the second contact area of the laser bar and the second heat conducting body. These layers, which may for example consist of indium, bring about a material bond during the clamping. It is disadvantageous that very high requirements are demanded of the evenness of the laser bar and of the evenness of the terminal areas of the two heat conducting bodies and of the maintenance of the parallelism of the areas during assembly. Deviations in the μm range may already lead to extensive voids, at which there is no material bond. In particular, an inadequately formed material bond at the p-side contact area of the laser bar may lead to overheating and even to burning-up of the laser bar. Furthermore, a migration of material of the indium layers may occur. This may cause the laser to fail.

Problem Addressed by the Invention

The problem addressed by the invention is that of providing a method for producing a diode laser that is designed for a high operating current. The laser bar is intended as far as possible not to undergo during assembly and operation any undesired mechanical stresses that could impair the electrooptical properties. The method is intended to be tolerant to unevennesses of the laser bar and/or of the contact areas of the heat conducting body or of the cover. The p-side contact area of the laser bar (epitaxial side), which is facing the heat conducting body, is intended to have a best-possible evenness after assembly. It is intended in this way to achieve a lowest-possible smile value for the laser bar. The probability of failure of the diode laser is intended to be low. Apart from the method for production, such an advantageous diode laser is to be provided.

Solution to the Problem

The problem is solved by a method for producing a diode laser, characterized by the following steps:
a. providing at least one laser bar, which has on a first side a first contact area, which is formed as at least one p contact, and on a second side opposite from the first side a second contact area, which is formed as at least one n contact,
b. providing a heat conducting body having a first terminal area,
c. providing a cover having a second terminal area,
d. providing a second metal layer, which has multiple raised locations and multiple depressed locations in a sectional plane,
e. arranging the laser bar between the heat conducting body and the cover, the first contact area facing the first terminal area of the first heat conducting body and the second contact area facing the second terminal area of the cover, and the second metal layer being arranged at least in certain portions between the second terminal area and the second contact area,
f. producing at least one force, which has a component that presses the cover in the direction of the heat conducting body, the first contact area being pressed flat against the first terminal area under the effect of the force, the second metal layer undergoing a plastic deformation at least in certain portions in the region of the raised locations,
g. establishing a mechanical connection of the cover with respect to the heat conducting body.

With this method, a diode laser as claimed in claim 9 that solves the problem addressed by the invention can be produced.

Specifically, a second metal layer as claimed in claim 11, formed as a nubbed structure, may be used for producing a clamped connection in the aforementioned method according to the invention.

Advantages of the Invention

The method according to the invention can be advantageously used for producing a diode laser that is designed for a high operating current. The method is tolerant to unevennesses of the laser bar and/or of the contact areas of the heat conducting body or of the cover. This allows the yield in the production of the lasers to be increased. The p contact area of the laser bar, which is facing the heat conducting body, has a particularly good evenness after assembly. As a result, the laser bar can have a lowest-possible smile value, so that it is outstandingly suitable for beam shaping. Furthermore, the problem of migration of solder material of a p-side metal layer can be avoided. The assembly of the laser bar involves little mechanical stress. Therefore, outstanding electrooptical properties can be achieved, for example a high polarization factor, a uniform near field distribution of the laser radiation and a great steepness of the power-current characteristic. Furthermore, the p-side current input can be improved.

DESCRIPTION

The diode laser according to the invention is a device for the emission of laser radiation that has a laser bar as a beam source. The laser bar may be formed in a known way as an edge-emitting diode laser bar and comprise one emitter or preferably multiple emitters, which may be arranged respectively offset in relation to one another in a y direction. The laser bar may preferably have a width in the y direction of between 0.3 mm and 12 mm. It may preferably have 1 to 49 emitters. The thickness of the laser bar in a z direction may preferably be between 0.05 mm and 0.2 mm. The length of the emitters of the laser bar in an x direction may preferably be between 0.5 mm and 6 mm. The direction of the central rays of the emitted laser radiation may be the x direction. The directions x, y and z may be at right angles to one another. The laser bar may have a known epitaxially produced layer sequence as a p-n junction with one or more quantum wells. The epitaxial layer may be considerably thinner than the substrate. The epitaxial layer may for example be between 3 μm and 20 μm thick. The substrate may for example be between 50 μm and 200 μm thick. The individual emitters may preferably be formed as broad-stripe emitters or as ridge waveguides or as trapezoidal lasers. There may also be multiple layer sequences, i.e. multiple p-n junctions lying electrically in series. Such bars are also referred to as a Nanostack. In this case, multiple emitters may be stacked one on top of the other in the z direction.

The facets of the laser bar may be provided with mirrors, for example a highly reflective mirror layer may be provided on the rear facet of the laser element and a low-reflecting mirror layer with a reflectivity of for example 0.1% to 10% may be provided on the opposite exit-side facet, which contains the exit aperture. The mirrors may define a laser resonator, which makes laser operation possible. The laser bar may however also be formed as a gain element, which is only intended for laser operation in interaction with an external resonator. In this case, for example, a wavelength-dependent feedback can be provided through the external resonator, serving for setting the wavelength of the laser. Such an electrooptical gain element may also be understood as a laser bar in the sense of the invention.

The laser bar is pumped by an electric current. The operating current may be for example 1 A to 1000 A. For the current input, a first contact area and a second contact area are provided on the laser bar. The p-side contact area may be referred to as the first contact area. The first contact area may be the anode of the diode laser bar. The n-side contact area of the laser bar may be referred to as the second contact area. The second contact area may be the cathode of the laser bar. The first and second contact areas may each lie in an xy plane. The first contact area may be arranged on the epitaxial side of the laser bar, which may be referred to as the first side, while the second contact area may be arranged on the substrate side of the laser bar, which may be referred to as the second side.

During operation, the laser bar may develop waste heat, which has to be removed. A heat conducting body having a first terminal area is provided for this purpose. Since the p-n junction of the diode laser may be located in the epitaxial layer (i.e. near the first side) and the predominant part of the waste heat can occur in the p-n junction, the heat conducting body may preferably be connected to the first side of the laser bar. The first contact area may be electrically and thermally connected to the first terminal area and the second contact area may be electrically connected to the second terminal area.

The method according to the invention serves for producing a diode laser. Provided for this purpose is a laser bar, which has on a first side a first contact area, which is formed as at least one p contact, and on a second side opposite from the first side a second contact area, which is formed as at least one n contact. The first contact area may be formed as a contact area for all the emitters. It may however also consist of multiple individual sub-areas, which may be separate from one another, for example one sub-area for each emitter. The first contact area may for example be a metallization, the outer layer may for example be a gold layer. A galvanically reinforced gold layer with a thickness of preferably greater than 0.5 μm, particularly preferably between 1 μm and 10 μm, may preferably be used in this case. The second contact area may be formed as a contact area for all the emitters. It may however also consist of multiple individual sub-areas, for example one sub-area for each emitter. The second contact area may for example be a metallization, the outer layer may for example be a gold layer.

It is also possible to provide multiple laser bars, which may for example be arranged next to one another or one on top of the other on the heat sink.

A heat conducting body having a first terminal area is also provided. The heat conducting body may for example consist at least partly of copper, aluminum or of a copper-diamond, aluminum-diamond or silver-diamond composite material or comprise such a material. It may for example be made as a copper body with an inlay of a composite material. It may however also for example be produced entirely from copper. The heat conducting body may have a metallization, for example Ag/Au, or Ni/Au or Ti/Pt/Au, the gold layer preferably being provided on the outside. The first terminal area may be made with a particularly good evenness, in order thereafter to achieve a low smile value (deviation of the individual emitters from a straight line). Further first terminal areas for further laser bars may also be provided.

At least one cover having a second terminal area is also provided. The cover may be intended for the electrical contacting of the n contact of the laser bar. It may likewise be intended for heat dissipation, but does not have to be. It may consist of a material with good electrical conductivity, for example at least partly of copper, aluminum or of a copper-diamond, aluminum-diamond or silver-diamond composite material or comprise such a material. It may for example be made as a copper body with an inlay of a composite material. It may however also for example be produced entirely from copper. The cover may have a metallization, for example Ag/Au, or Ni/Au or Ti/Pt/Au, the gold layer preferably being provided on the outside.

According to the invention, a second metal layer, which has multiple raised locations and multiple depressed locations in a sectional plane, is provided. In the sense of the present invention, the layer thickness of the second metal layer may be location-dependent. There may be multiple raised locations and/or multiple depressed locations. Locations of the second metal layer that have a maximum of the layer thickness are referred to as raised locations. A raised location is therefore such a location that protrudes further above the surface than surrounding locations. In a topographical consideration, a raised location may be formed as a dome, as a plateau or as a ridge. Locations that respectively have a minimum of the layer thickness are referred to as depressed locations of a layer. In a topographical consideration, a depressed location may be formed as a hollow, as a dip or as a basin. The layer thickness at the depressed locations may be greater than or equal to zero. In the second case, there may be no layer material present at the depressed locations; the layer may therefore have interruptions. At the raised locations, the layer thickness may be equal and have a value D. The raised locations may be formed as a topologically contiguous area or as multiple sub-areas. The depressed locations may be formed as a topologically contiguous area or as multiple sub-areas. Multiple raised locations and multiple depressed locations may be cut in a sectional plane, which may be perpendicular to the plane of the layer. The sectional plane may therefore be chosen such that it contains a normal to the plane of the layer. In such a sectional representation, it is possible for example for multiple depressed locations to be visible. Even if these locations may be formed as a contiguous area in a three-dimensional consideration, the sectional plane may nevertheless have the multiple depressed locations in the sense according to the invention. The same applies to the raised locations. It should also be pointed out that there do not have to be multiple raised locations and multiple depressed locations in every arbitrary sectional plane that is perpendicular to the plane of the layer. For example, the multiple raised locations and the multiple depressed locations may be visible in a cross section, whereas they are not visible in a longitudinal section.

In a preferred embodiment, the raised locations may be formed as strip-shaped plateaus of the height D, which for example run in the x direction, no layer material being present between the strips. Then, the second metal layer would have in the sense according to the invention multiple raised locations and multiple depressed locations in a yz sectional plane (cross section).

In a further preferred embodiment, a second metal layer, which has multiple raised locations and multiple depressed locations in a sectional plane, is provided by the second metal layer being applied as a nubbed structure to the second contact area or to the second terminal area. In this case, the raised locations may be formed as circular plateaus of the height D, which can be imagined for example as cylindrical nubs, no layer material being present between the nubs. Such a layer may for example be produced by a coating process using a perforated mask. The depressed locations of the layer may then be a contiguous area in a three-dimensional topological consideration. This area could be considered as a low plane (basin). In this case, the second metal layer may have in the sense according to the invention multiple raised locations and multiple depressed locations in a yz sectional plane (cross section). It may be advantageous to form the nubbed structure with a coverage density of at least one nub per square millimeter of area of the layer, particularly advantageously at least five nubs per square millimeter. The distance between adjacent nubs should not be chosen to be too great; a maximum distance of 1 mm, measured from edge to edge of adjacent nubs, may be advantageous. The second metal layer may differ from conventional solder bumps in particular by the finer structure and the smaller layer thickness.

According to the invention, the laser bar is arranged between the heat conducting body and the cover, the first contact area facing the first terminal area of the first heat conducting body and the second contact area facing the second terminal area of the cover, and the second metal layer being arranged at least in certain portions between the second terminal area and the second contact area.

According to the invention, at least one force is produced, having a component that presses the cover in the direction of the heat conducting body. That may be the direction−z. The first contact area is pressed flat against the first terminal area under the effect of the force. That can lead to a clamped connection. Under this applied pressure, unevennesses of the second contact area can be evened out. This may involve the laser bar being elastically deformed. The second metal layer may in this case undergo a plastic deformation at least in certain portions in the region of the raised locations. At these locations, the yield point of the layer material (compressive yield point) may be exceeded. The second contact area may then be electrically connected to the second contact area by means of the second metal layer. At the depressed locations, the second metal layer may have cavities. Consequently, the second metal layer may have both connected locations, at which the second contact area is continuously connected to the second terminal area in the direction of the normal n, and also interrupted locations, at which the second contact area is not continuously connected to the second terminal area in the direction of the normal n. The normal n to the layer may be the normal to the second contact area, that is to say the z direction. The connected locations and the interrupted locations can therefore be projected onto an xy plane. In this case, the interrupted locations may advantageously have an overall area that is at least 20% of the area content of the second contact area. Considered individually, the interrupted locations should not be chosen to be too great, in order to avoid an uneven current input into the second contact area. In the projection onto the xy plane, for each point that belongs to an interrupted location the distance from the nearest point that belongs to a connected location should be no more than 0.5 mm, advantageously no more than 0.25 mm.

The establishing of a mechanical connection of the cover with respect to the heat conducting body is also envisaged. An electrically insulating connection may be advantageously provided, in order that the laser bar is not short-circuited. The connection may be performed by means of a joining agent. An adhesive may be used for example as the joining agent. An adhesive bond over the surface area with a thermally conductive adhesive may be used particularly advantageously. A distance or a separating trench may be provided between the laser bar and the joining area, in order to avoid wetting of the laser bar with adhesive. The establishing of the mechanical connection may entail a volume shrinkage of the joining agent. The mechanical connection may be intended for producing and/or maintaining the force. In this way, the clamped connection of the laser bar between the heat conducting body and the cover can also be maintained.

The second metal layer may be formed as a relief. The layer thickness may be location-dependent. The topography of the layer thickness may be such that it can be represented in a one-plane projection. The minimum linear dimension of raised locations may be considered as being the structure size (feature size). It may for example be the diameter of circular plateaus or the width of strip-shaped plateaus. For the determination of a minimum structure size in the general case, the contour lines of an average height between the level of the depressed locations and the raised locations may be used. The structure size may be for example the dome diameter at half the dome height or the ridge width at half the ridge height. The minimum structure size may advantageously lie between 10 μm and 1000 μm. The average contour line may have an overall length. In the case of an non-contiguous average contour line, the overall length should be understood as meaning the sum of the lengths of the individual segments of the average contour line. In other words, the overall length of the average contour line may also be considered as being the sum of the peripheries of the sectional areas taken as a section at the average contour line. The overall length L of the average contour line within a certain base area A may be set as a ratio in relation to this base area, for example the overall area of the second metal layer. This ratio, i.e. the quotient L/A, may advantageously lie between 1000 m/m² and 100 000 m/m². If the relief is structured too coarsely, that is to say the ratio L/A is too small, the plastic deformation of the second metal layer may be impaired. If the relief is structured too finely, that is to say the ratio L/A is too great, it may happen that the thermal and electrical attachment of the laser bar to the heat conducting body or the cover becomes poorer over time.

The second metal layer may consist of a soft metal, which preferably has a yield point under compressive loading (compressive yield point) of less than 50 MPa, particularly preferably less than 20 MPa or most particularly preferably less than 10 MPa. The second metal layer may consist of a heavy metal, such as for example tin, lead, indium or cadmium or comprise such a metal. Indium and/or tin may be usable with preference, since lead and cadmium are less environmentally compatible.

The plastic deformation of the second metal layer may take place without heating, at room temperature. It is also possible however for heating to be provided, so that the plastic deformation may take place at an increased temperature. The temperature may advantageously lie below the liquidus temperature and/or below the solidus temperature of the second metal layer. As a result, melting of the second metal layer can be avoided. It has been found that an advantageous more uniform power distribution of the laser radiation over the individual emitters of a laser bar can be achieved if the second metal layer is not melted.

The plastic deformation of the second metal layer may take place without volume compression. During the deformation, the thickness of the second metal layer may be reduced at least in certain portions at the raised locations. Excess material may be forced in the direction of the depressed locations, without the overall volume of the material experiencing a notable change. This would not be possible with a uniformly thick layer.

After the plastic deformation of the second metal layer, intermetallic phases that restrict or prevent further plastic deformation may form at the raised locations of the second metal layer. Such intermetallic phases may take place as a result of diffusion, for example at room temperature, or during a conditioning process below the respective melting temperature (solidus temperature) of the material of the second layer and of the intermetallic phases. Such a diffusion process may proceed very slowly, for example it may take several minutes, hours, days, weeks or months. For example, the second terminal area and/or the second contact area may be made with a gilded surface. Then gold can diffuse at least partially into the second metal layer, consisting for example of tin and/or indium. This may produce a gold-tin or gold-indium phase, which is very hard in comparison with the tin or indium and can no longer be plastically deformed. Since the formation of intermetallic phases can take a very long time, the plastic deformation of the second metal layer according to the invention is not hindered by the effect of the force. Advantageously, a first metal layer may also be provided. When arranging the laser bar, the first metal layer may be arranged at least in certain portions between the first terminal area and the first contact area. The first metal layer may have a uniform layer thickness. That may be advantageous because a better evenness of the p side of the laser bar can then be achieved. The first metal layer may consist of a soft heavy metal, such as for example tin, lead, indium or cadmium or comprise such a metal. Indium and/or tin are preferably to be used, since lead and cadmium are less environmentally compatible.

The first or second metal layer may also protrude beyond the first or second contact area, respectively.

The first or second metal layer may be produced by coating. Coating is understood in production engineering as meaning a main group of the manufacturing processes in accordance with DIN 8580 that are used for applying an adhering layer of formless substance to the surface of a workpiece. The corresponding operation and the applied layer itself are also referred to as coating. A coating may be a thin layer or a thick layer and may comprise multiple contiguous layers; the distinction is not precisely defined and depends on the coating method and the intended application. In the sense of the present invention, a coating with a location-dependent layer thickness is also referred to as a layer.

The second metal layer may be produced by coating the second terminal area. Galvanic or physical coating methods (for example vapor depositing, sputtering) may be used for this purpose. The coating may be performed with a mask, in order to produce the depressed and raised locations. Alternatively, a uniformly thick layer may also be coated, and the depressed and raised locations are produced thereafter, for example by embossing, scoring or etching. The second metal layer may also be produced by coating the second contact area of the laser bar.

The second metal layer may also be made as a self-supporting layer, which may be produced for example by embossing a metal foil.

With respect to the raised locations, the second metal layer may be made thicker than the first metal layer. The second metal layer may preferably have a thickness at the raised locations of 3 μm to 100 μm, particularly preferably between 5 μm and 15 μm. The first metal layer may preferably have a uniform thickness of less than 5 μm, particularly preferably less than 3 μm.

The second metal layer may be applied to the second terminal area. The first metal layer, if provided, may be applied to the first terminal area. The second metal layer may be applied to the second contact area. The first metal layer, if provided, may be applied to the first contact area. Still further metal layers may also be provided between the second contact area and the second terminal area.

The second metal layer may have a degree of volume filling that is preferably between 5% and 95% and/or particularly preferably between 10% and 50%. The degree of volume filling should be understood as meaning the ratio of the material volume to the product of the base area D and the layer thickness D of the virgin (not yet deformed) layer. In the case of this calculation, the layer thickness D is the layer thickness at the raised locations.

The invention also includes a diode laser. The diode laser according to the invention comprises at least one edge-emitting laser bar with a first contact area, which is formed as a p contact, and a second contact area, which is formed as an n contact, a heat conducting body having a first terminal area, a cover having a second terminal area and a second metal layer. The laser bar is arranged between the heat conducting body and the cover. The second metal layer is arranged at least in certain portions between the second terminal area and the second contact area. The cover is mechanically connected to the heat conducting body. The first contact area is thermally and electrically connected over the surface area to the first terminal area of the first heat conducting body. This means that, by way of this connection, a heat dissipation that is as good as possible of the waste heat from the laser bar to the heat conducting body is possible and at the same time an electrical connection with the lowest possible resistance is made possible for the feeding of the operating current to the laser bar. The second contact area is electrically connected to the second terminal area by means of the second metal layer. This means that this connection is also intended to be formed with the lowest possible resistance. The second metal layer has connected locations, at which the second contact area is continuously connected to the second terminal area in the direction of the normal n, i.e. the z direction. The second metal layer also has interrupted locations, at which the second contact area is not continuously connected to the second terminal area in the direction of the normal n. Decisive for whether a point of the plane of the layer is to be assigned to a connected location or an uninterrupted location in this case is whether at this point there is a continuous material bond in the normal direction n, or whether there is at least one void in the normal direction n. The normal n to the layer may be the normal to the second contact area, that is to say the z direction. The connected locations and the interrupted locations can therefore be projected onto an xy plane. In this case, the interrupted locations may advantageously have an overall area that is at least 20% of the area content of the second contact area. Considered individually, the interrupted locations should not be chosen to be too great, in order to avoid an uneven current input into the second contact area. In the projection onto the xy plane, for each point that belongs to an interrupted location the distance from the nearest point that belongs to a connected location should be no more than 0.5 mm, advantageously no more than 0.25 mm.

The cover may advantageously be provided as making a contribution to the heat dissipation from the second contact area. The voids in the second metal layer, i.e. the interrupted locations, may remain free or alternatively be filled with a further joining agent, for example an epoxy resin. The filling of the voids may take place in a further method step. If appropriate, the mechanical strength of the connection can in this way be improved in comparison with a connection with unfilled cavities. The cover may be thermally and mechanically connected to the heat conducting body by means of an electrically insulating joining agent.

The use according to the invention of a second metal layer that is produced with the involvement of a coating process and has a nubbed structure may be advantageous, the nubbed structure having a coverage density with at least one nub per square millimeter of area of the layer, for producing a clamped connection for a diode laser, the second metal layer being arranged between a second n-side contact area of a laser bar and a second terminal area of a cover and the second metal layer being provided on the second contact area or on the second terminal area.

The figures show the following:

FIG. 1 shows the operating principle by a first exemplary embodiment before assembly FIG. 2 shows the operating principle by the first exemplary embodiment after assembly FIG. 3 shows the first exemplary embodiment in a side view FIG. 4 shows a second exemplary embodiment FIG. 5 shows a third exemplary embodiment FIG. 6 shows the cover of a fourth exemplary embodiment FIG. 7 shows the cover of a fifth exemplary embodiment FIG. 8 shows the cover of a sixth exemplary embodiment FIG. 9 shows the cover of a seventh exemplary embodiment FIG. 10 shows a longitudinal section of the third exemplary embodiment FIG. 11 shows a cross section of the third exemplary embodiment FIG. 12 shows a longitudinal section of the fifth exemplary embodiment FIG. 13 shows a cross section of the fifth exemplary embodiment FIG. 14 shows a longitudinal section of an eighth exemplary embodiment FIG. 15 shows a cross section of the eighth exemplary embodiment FIG. 16 shows a longitudinal section of a ninth exemplary embodiment FIG. 17 shows a cross section of the ninth exemplary embodiment FIG. 18 shows a cross section of a tenth exemplary embodiment FIG. 19 shows a cross section of an eleventh exemplary embodiment FIG. 20 shows a one-plane projection of the second metal layer.

It should be pointed out that the figures are not drawn to scale. Exaggerated representations are required to illustrate the invention.

EXEMPLARY EMBODIMENTS

The invention is to be illustrated on the basis of a first exemplary embodiment in FIG. 1, FIG. 2 and FIG. 3. FIG. 1 shows the operating principle by a first exemplary embodiment before the assembly of the diode laser 1 in a front view. Shown is a provided laser bar 3 having multiple emitters 6, which has on a first side 7 a first contact area 8, which is formed as a p contact (anode), and on a second side 9 opposite from the first side a second contact area 10, which is formed as an n contact (cathode). The laser bar has thickness variations and a curvature. These features are greatly exaggerated in order to illustrate the operating principle of the invention. Also shown is a provided heat conducting body 11 having a first terminal area 12. The first terminal area is coated with a first metal layer 16 (shown with cross-hatching) of indium. Also shown is a provided cover 14 having a second terminal area 15. This area has a slight unevenness, which is shown exaggerated. Applied to the second terminal area is a second metal layer 17 of indium (shown with cross-hatching), which has multiple raised locations 19 and multiple depressed locations 20. The second metal layer may consequently be provided together with the cover. No layer material is present at the depressed locations 20. The laser bar is arranged between the heat conducting body 11 and the cover 14, the first contact area 8 facing the first terminal area 12 of the heat conducting body and the second contact area 10 facing the second terminal area 15 of the cover, and the second metal layer 17 being arranged at least in certain portions between the second terminal area 15 and the second contact area 10. The second metal layer is provided in this example in such a way that it does not protrude beyond the second contact area in the y direction. However, in one portion it protrudes beyond the contact area in the −x direction, as can be seen from FIG. 3 described below.

FIG. 2 shows the diode laser 1 during or after assembly. At least one force 24 is produced, having a component that presses the cover 14 in the direction of the heat conducting body 11. The first contact area 8 is pressed flat against the first terminal area 12 under the effect of the force, the second metal layer 17 undergoing a plastic deformation at least in certain portions in the region of the raised locations 19. The volume of the layer material is preserved, it being possible for excess material to be forced into the depressed locations. As can be seen, the aforementioned unevennesses, thickness variations and curvatures are evened out and thereafter the emitters 6 lie in a line. The laser bar may in this case be elastically deformed. The first metal layer is not compressed, or scarcely compressed, since it is made with a uniform thickness. As can be seen, the second metal layer 17 establishes a connection of the second contact area to the second terminal area at the raised locations in the normal direction, i.e. in the z direction. At the depressed locations there is no continuous connection of the second contact area with respect to the second terminal area in the normal direction. Interrupted locations 23 at which there is no material bond are present there. A continuous connection in the normal direction only exists at the connected locations 22.

FIG. 3 shows the establishing of a mechanical connection of the cover 14 with respect to the heat conducting body 11 in a side view of the first exemplary embodiment. The mechanical connection is performed by means of an electrically insulating joining agent 31. The finished diode laser emits laser radiation 2 in the direction x. The position of the epitaxial layer structure 5 near the first contact area of the laser bar is likewise indicated by a dotted line.

It should be pointed out as a precaution that the hatchings in FIG. 1 to FIG. 9 are merely intended to emphasize the metal layers; they do not represent sectional areas.

In a modification (not shown) of the first exemplary embodiment, there is no first metal layer. The first contact area is placed directly onto the first terminal area.

FIG. 4 shows the front view of a second exemplary embodiment before the assembly of the diode laser 1. The second metal layer 17 has been applied to the second side of the laser bar and is provided together with the laser bar.

FIG. 5 shows the front view of a third exemplary embodiment before the assembly of the diode laser 1. The second metal layer 17 is provided as a self-supporting layer. In this example, the depressed locations 20 have a layer thickness greater than zero.

FIG. 6 shows a plan view (view from below) with the viewing direction z of the cover 14 of a fourth exemplary embodiment.

The raised locations 19 of the second metal layer are made as strip-shaped plateaus.

FIG. 7 shows a plan view (view from below) with the viewing direction z of the cover 14 of a fifth exemplary embodiment. The raised locations 19 of the second metal layer are made as strip-shaped plateaus.

FIG. 8 shows a plan view (view from below) with the viewing direction z of the cover 14 of a sixth exemplary embodiment with a nubbed structure. The raised locations 19 of the second metal layer are made as circular plateaus. In the representation, the raised locations are emphasized by a cross-hatching. These plateaus may also be referred to as cylindrical nubs. This nubbed structure is present on a main area A 18. The depressed locations form a contiguous area, which can be imagined as a basin (low plane), while the raised locations are individual non-contiguous plateau areas. In the topological sense, the low plane is a multiply contiguous area.

FIG. 9 shows a plan view (view from below) with the viewing direction z of the cover 14 of a seventh exemplary embodiment. The raised locations 19 of the second metal layer are made as circular plateaus of different sizes. The nubbed structure is present on a base area 18 and is distributed unevenly over this area. As a result, excessive pressure on the laser bar, for example in the peripheral region, can be avoided.

FIG. 10 shows a longitudinal section A-A of the third exemplary embodiment. The raised locations 19 are formed as strip-shaped plateaus 27, formed on the second terminal area 15. In this xz sectional plane (longitudinal section), a strip-shaped plateau 27 is shown in section.

FIG. 11 shows a cross section B-B of the third exemplary embodiment. The raised locations 19 are formed as strip-shaped plateaus 27 on the second terminal area 15, while the depressed locations 20 are formed as basins 30. Also indicated is the extent of the structure size s and the layer thickness D which can be measured at the raised locations. There are multiple raised locations 19 and multiple depressed locations 20 in this yz sectional plane (cross section).

FIG. 12 shows a longitudinal section C-C of the fifth exemplary embodiment. The raised locations 19 are formed as circular plateaus 27 on the second terminal area 15. There are multiple raised locations 19 and multiple depressed locations 20 in this xz sectional plane (longitudinal section).

FIG. 13 shows a cross section of the fifth exemplary embodiment. In the case of this example, there are also multiple raised locations 19 and multiple depressed locations 20 in the yz sectional plane (cross section) shown.

FIG. 14 shows a longitudinal section of an eighth exemplary embodiment. Here, the raised locations 19 of the second metal layer are made as ridges 26. The position of the sectional planes AA, BB, CC and DD may correspond to those of the aforementioned third and fifth exemplary embodiments.

FIG. 15 shows a cross section of an eighth exemplary embodiment.

FIG. 16 shows a longitudinal section of a ninth exemplary embodiment. Here, the raised locations 19 of the second metal layer are made as domes 25. The second metal layer is formed here as a nubbed structure.

Figure 1:
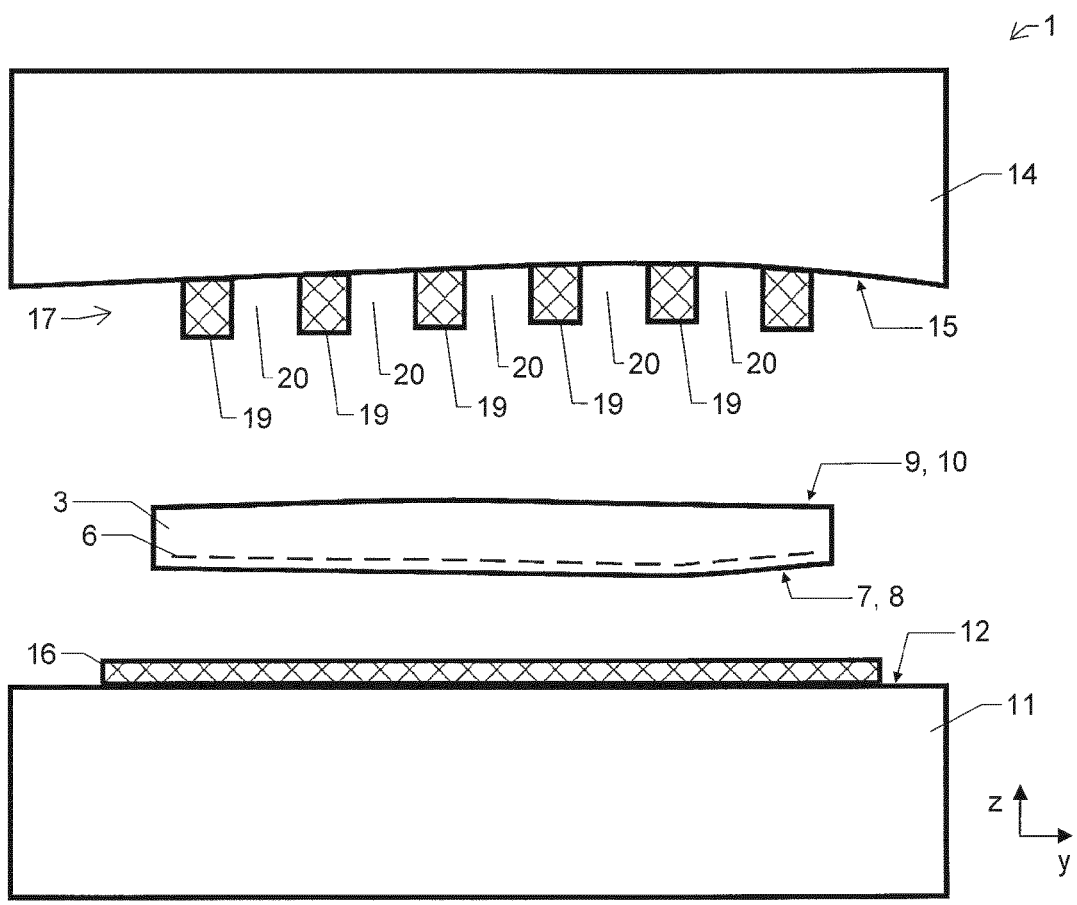
Figure 2:
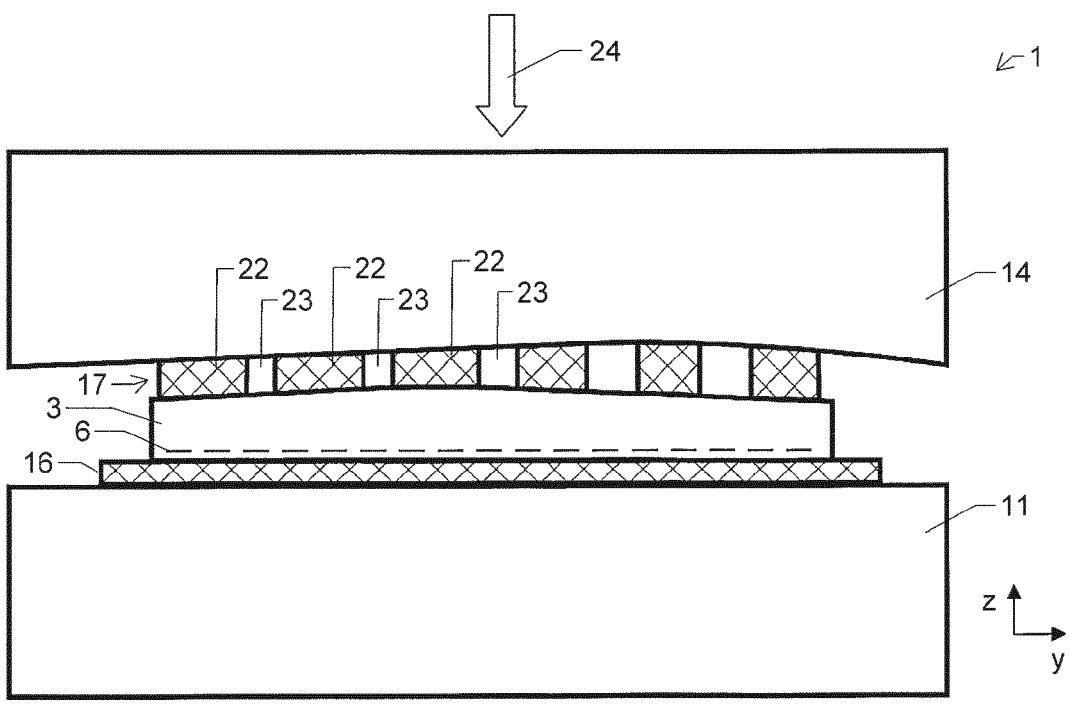
Figure 3:
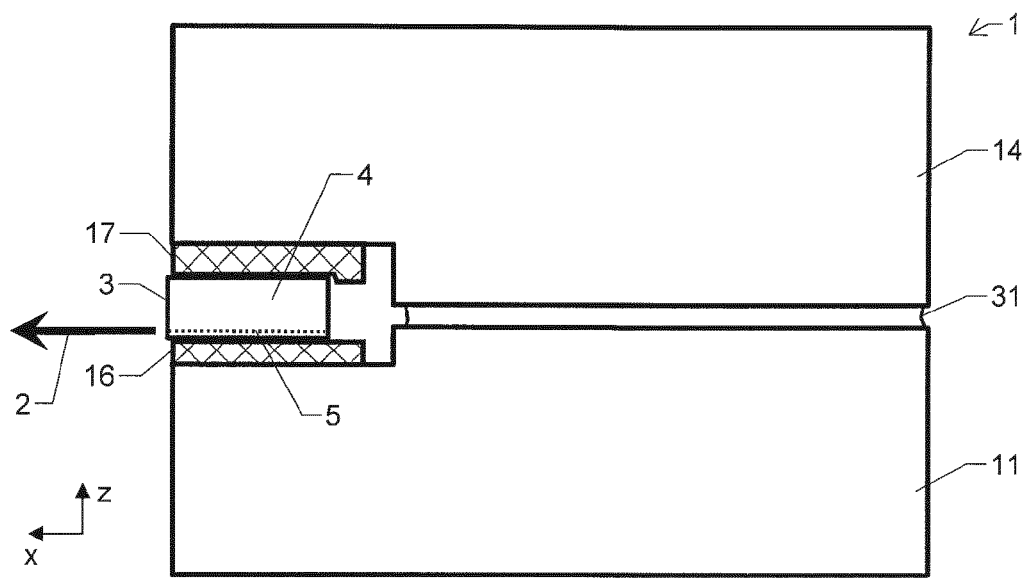
Figure 4:
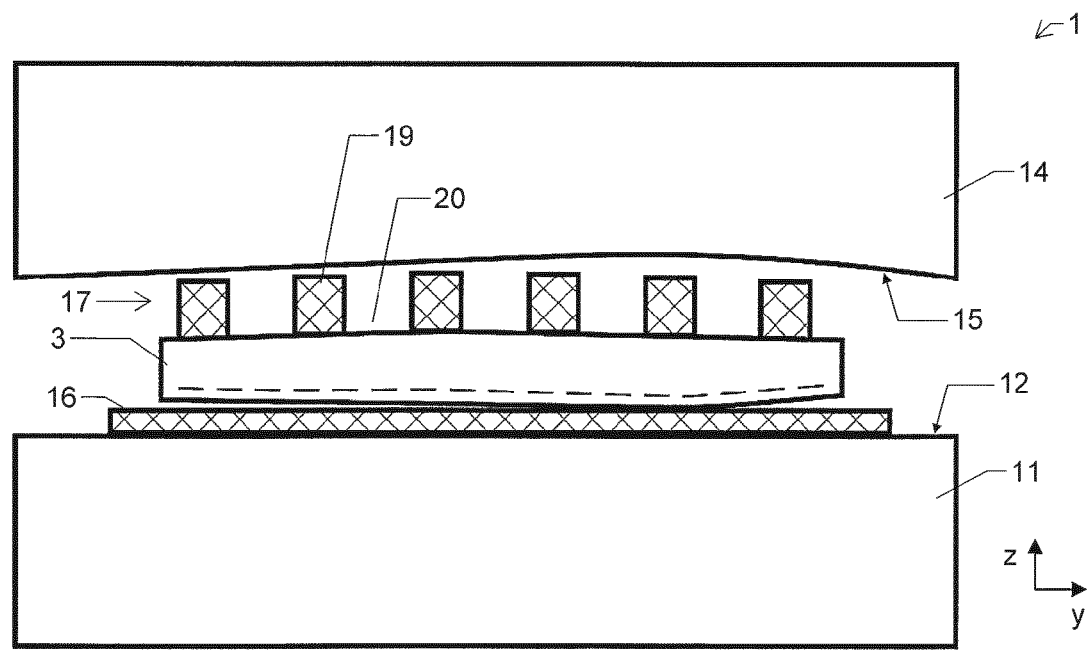
Figure 5:
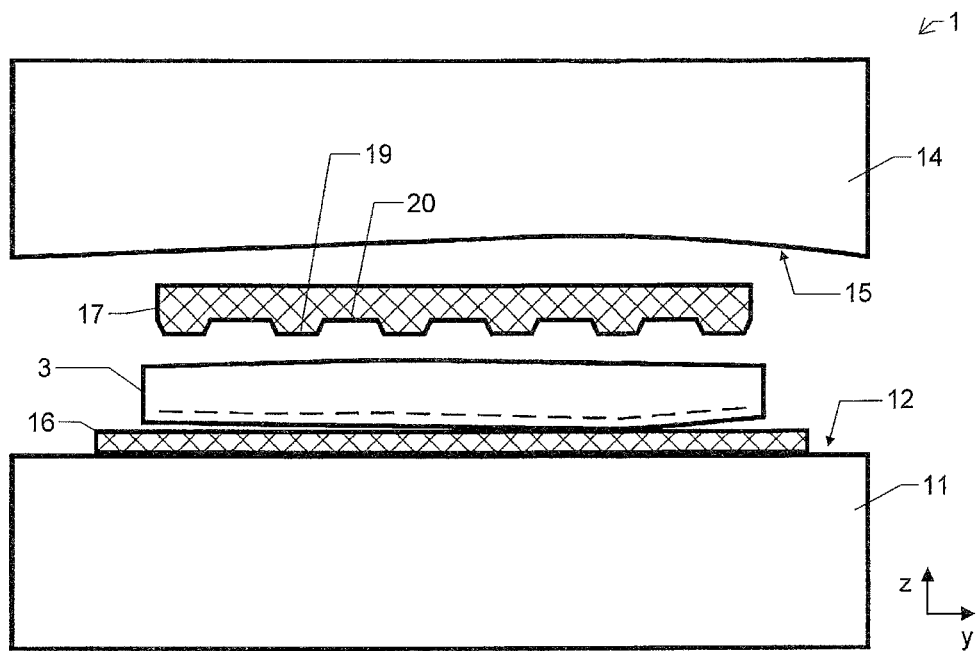
Figure 6:
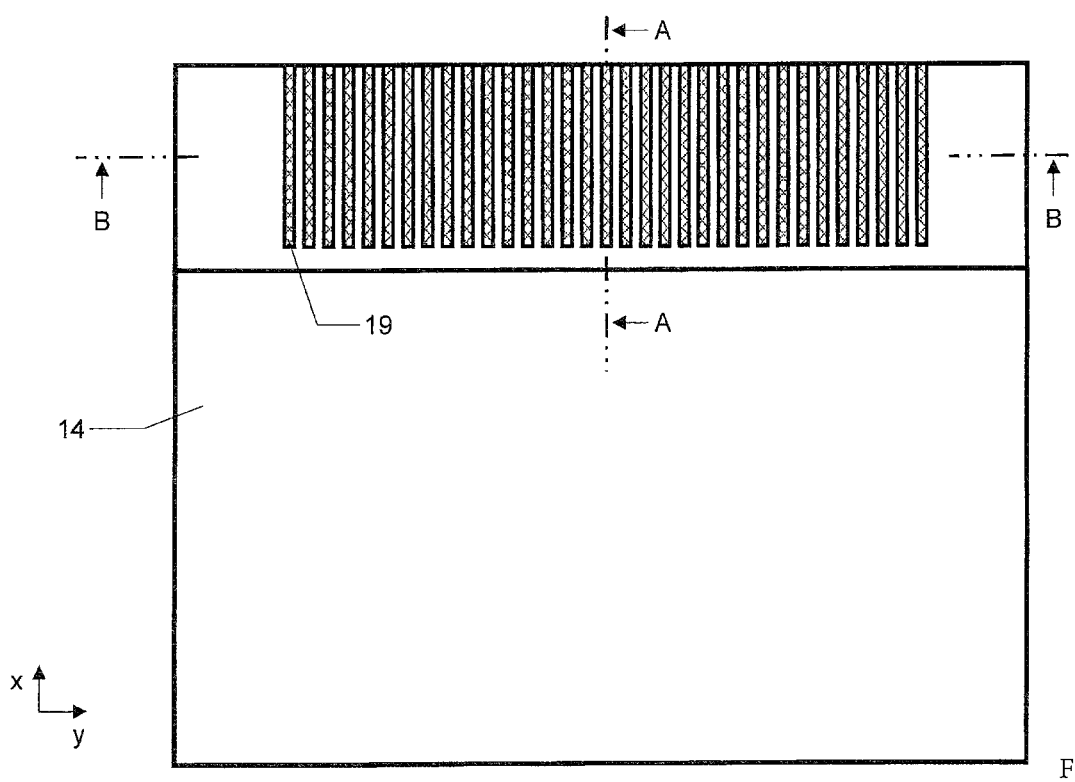
Figure 7:
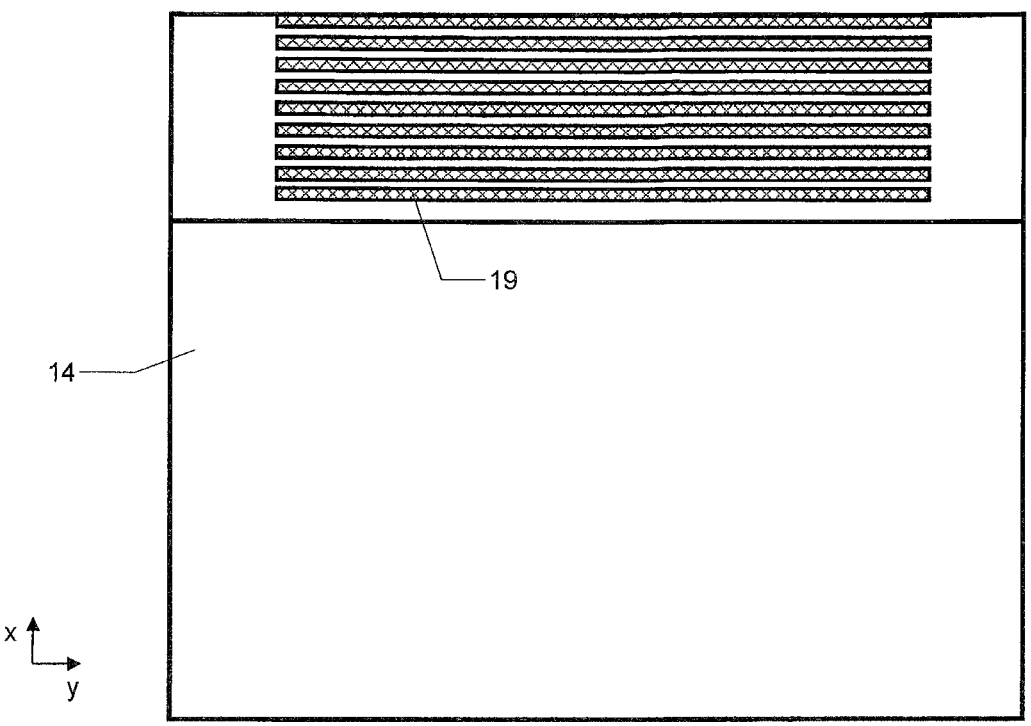
Figure 8:
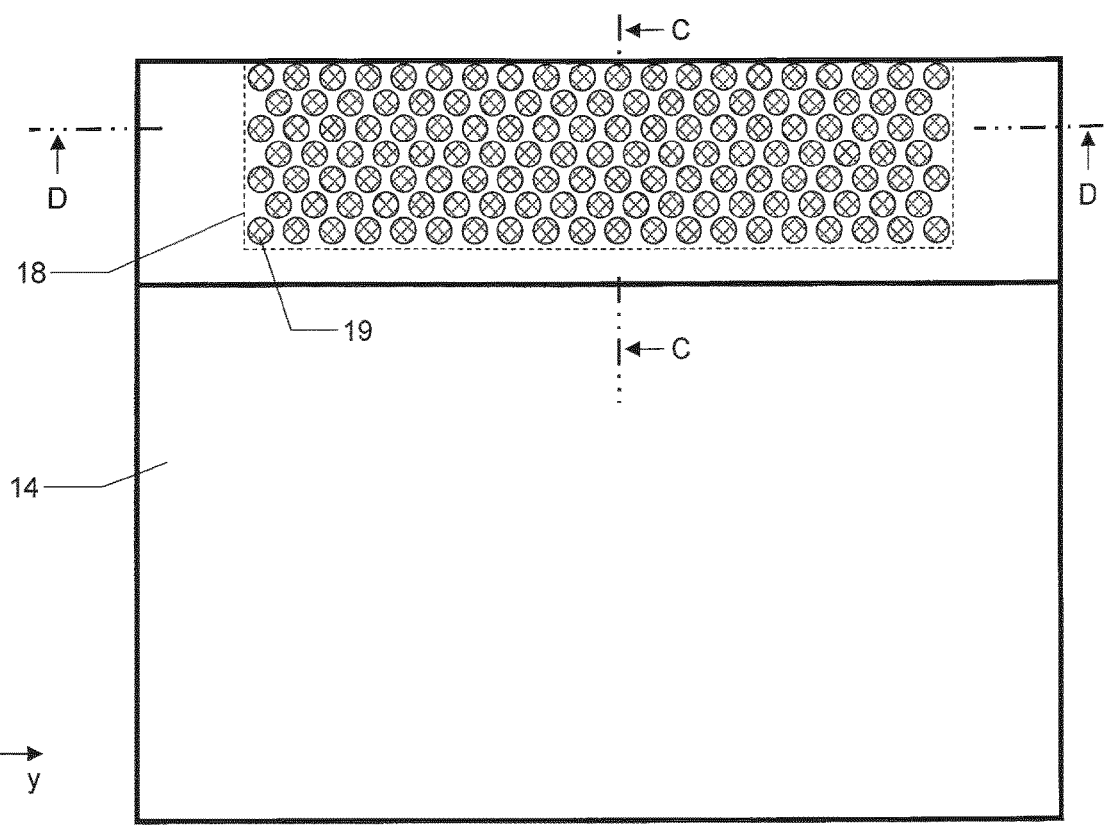
Figure 9:
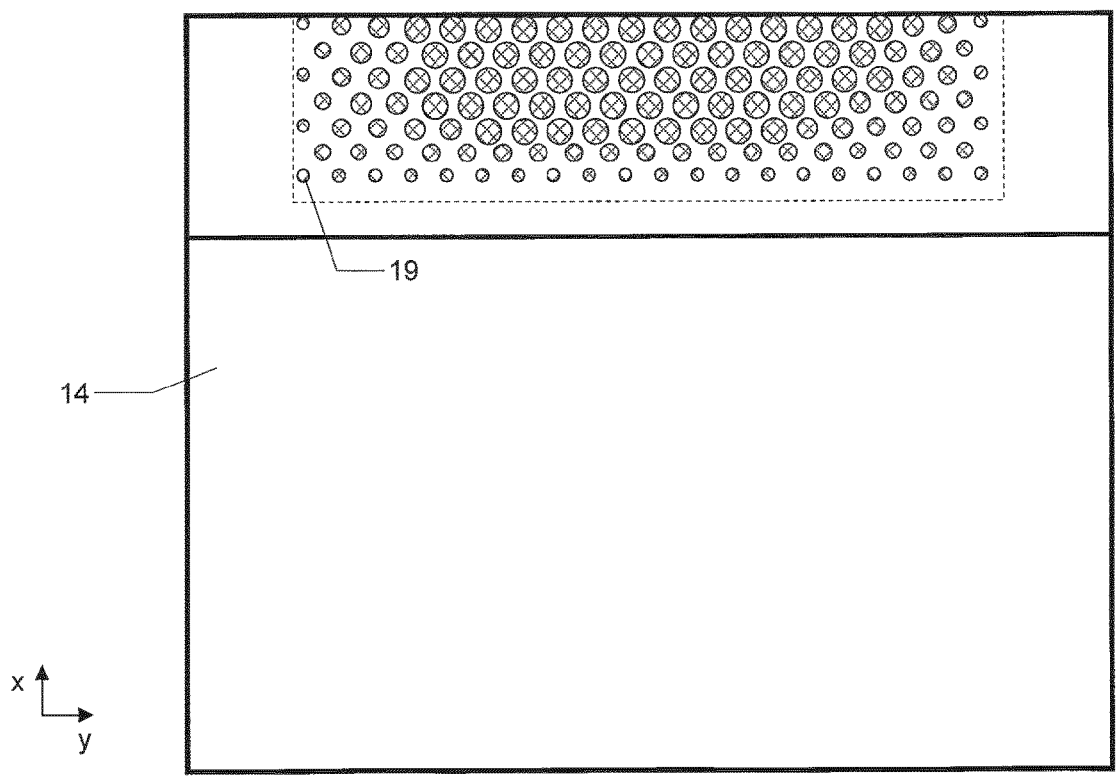
Figure 10:
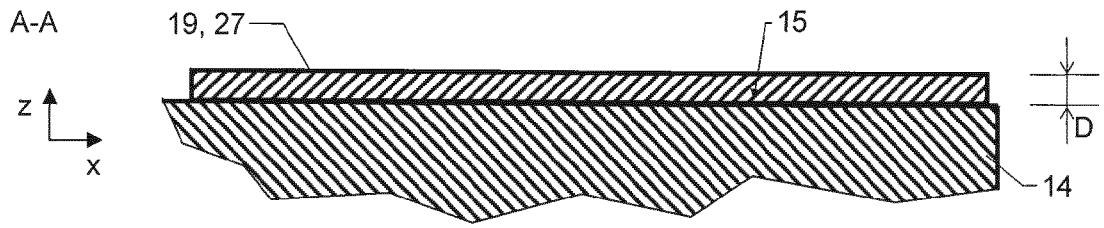
Figure 11:
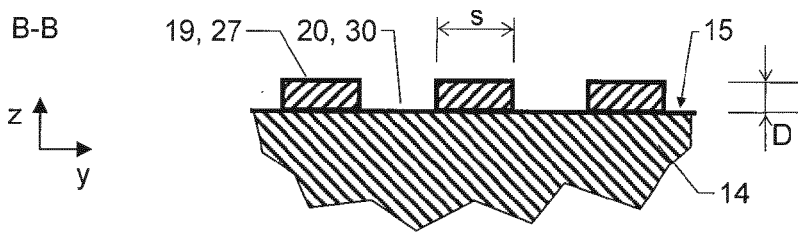
Figure 12:
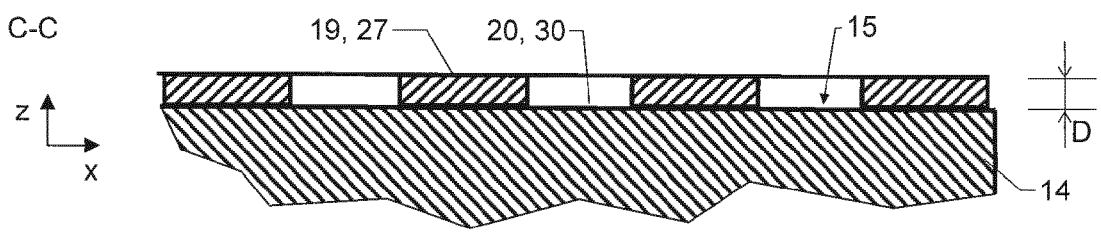
Figure 13:
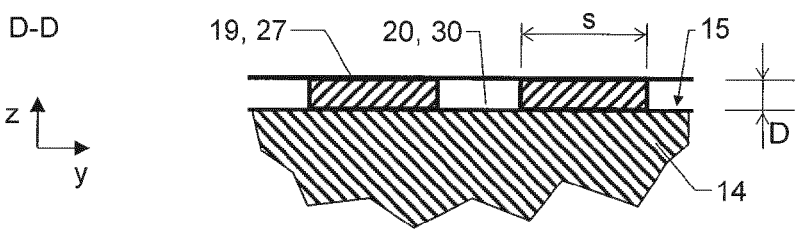
Figure 14:
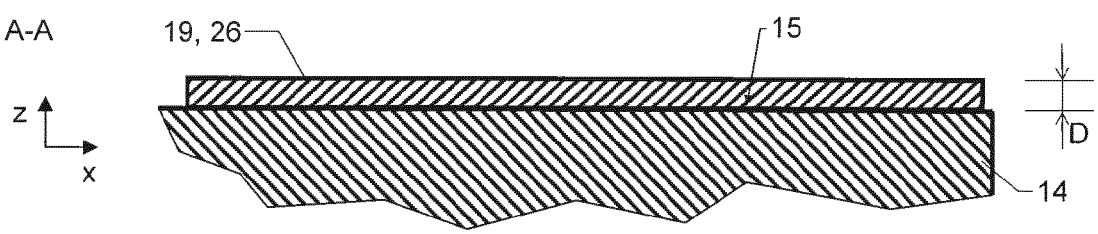
Figure 15:
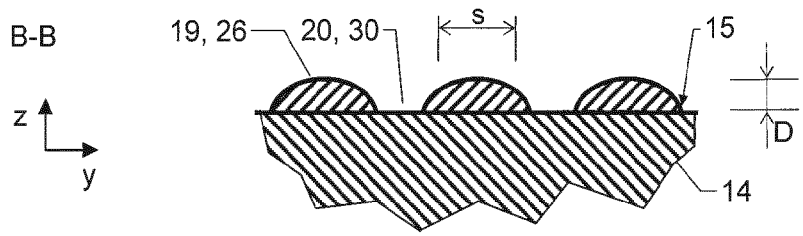
Figure 16:
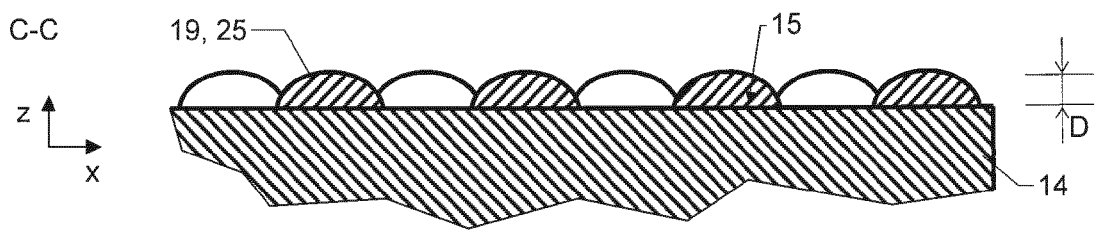
Figure 17:
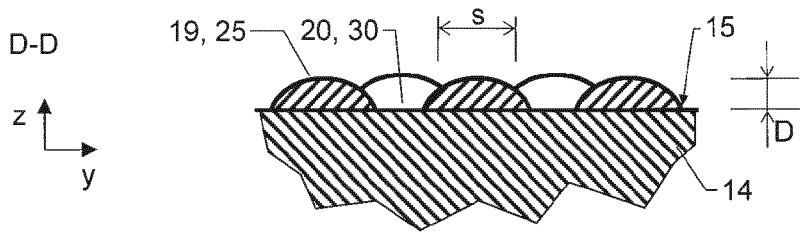
FIG. 17 shows a cross section of the ninth exemplary embodiment.
Figure 18:
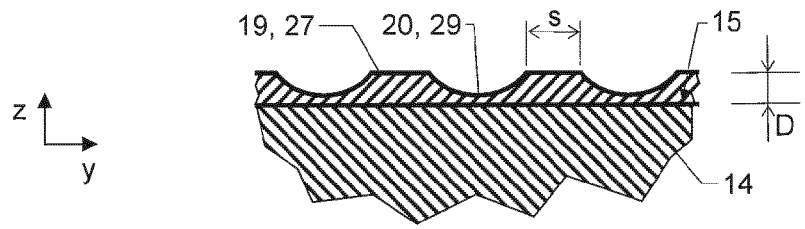
FIG. 18 shows a cross section of a tenth exemplary embodiment. Here, the depressed locations 20 are made as dips 29.
Figure 19:
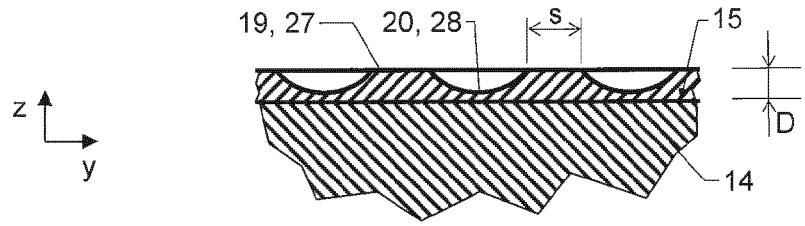

FIG. 19 shows a cross section of an eleventh exemplary embodiment. Here, the depressed locations 20 are made as hollows 28. The hollows may be made rotationally symmetrical about the axis of the vertex. The raised locations 19 form a contiguous plateau area 27, which in the topological sense may be multiply contiguous. The depressed locations are in this case non-contiguous, since each hollow of the plateau area is surrounded on all sides.

Figure 20:
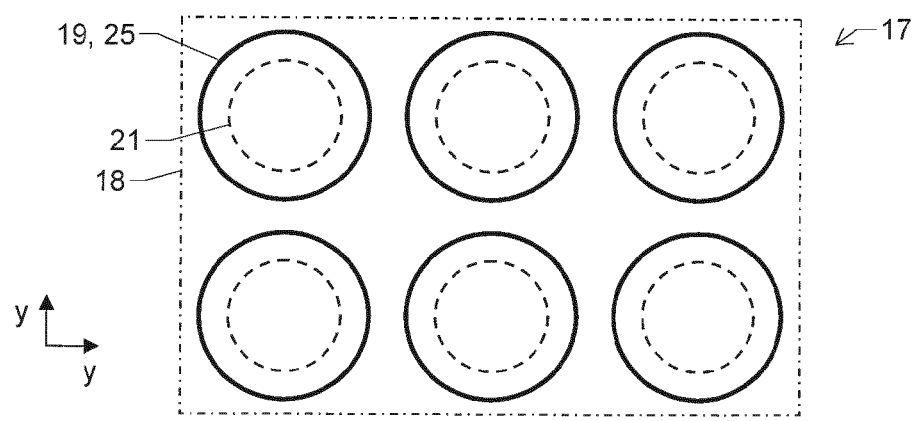

FIG. 20 shows a one-plane projection of the second metal layer 17 of a twelfth exemplary embodiment. Here, the raised locations 19 of the second metal layer are made as domes 25, which are arranged in a matrix. The determination of the contour lines is intended to be illustrated by this example. A base area A 18 with multiple raised locations may be chosen. That may also be the entire base area of the second metal layer. Each individual dome has an average contour line 21, which has a certain length.

The sum of all the lengths of the average contour line gives an overall length L. This can be used to determine the ratio L/A.

As a modification (not shown) of the first to twelfth exemplary embodiments, the second metal layer is produced by coating the second side of the laser bar. The exemplary embodiments mentioned can be combined with one another in various ways by a person skilled in the art within the scope of the invention.

DESIGNATIONS

1. Diode laser
2. Laser radiation
3. Laser bar
4. Substrate
5. Epitaxial layer
6. Emitter
7. First side
8. First contact area
9. Second side
10. Second contact area
11. Heat conducting body
12. First terminal area
13. Fiber core (core)
14. Cover
15. Second terminal area
16. First metal layer
17. Second metal layer
18. Base area
19. Raised location
20. Depressed location
21. Average contour line
21. Location connected in normal direction
23. Location interrupted in normal direction
24. Force
25. Dome
36. Ridge
27. Plateau
28. Hollow
28. Dip
30. Base
31. Joining agent

The invention claimed is:

1. A method for producing a diode laser, comprising:
providing at least one laser bar having curvatures and multiple emitters, which has on a first side a first contact area, which is formed as at least one p contact, and on a second side opposite from the first side a second contact area, which is formed as at least one n contact;
providing a heat conducting body having a first terminal area;
providing a cover having a second terminal area;
providing a first metal layer, the first metal layer being arranged at least in certain portions between the first terminal area and the first contact area, the first metal layer having a uniform layer thickness of less than 3 µm;
providing a second metal layer, which has multiple raised locations and multiple depressed locations in a sectional plane, the second metal layer being produced by galvanic coating, vapor deposition or sputtering and having a thickness at the raised locations of 5 µm to 15 µm;
arranging the laser bar between the heat conducting body and the cover, the first contact area facing the first terminal area of the heat conducting body and the second contact area facing the second terminal area of the cover, and the second metal layer being arranged at least in certain portions between the second terminal area and the second contact area;
producing at least one force, which has a component that presses the cover in the direction of the heat conducting body, the first contact area being pressed flat against the first terminal area under the effect of the force, the second metal layer undergoing a plastic deformation at least in certain portions in the region of the raised locations, thereby the curvatures of the at least one laser bar are evened out and thereafter the multiple emitters lie in a line;
establishing a mechanical connection of the cover with respect to the heat conducting body; and
filling voids within the second metal layer with an epoxy resin.

2. The method as claimed in claim 1, wherein the plastic deformation of the second metal layer takes place below the liquidus temperature of the second metal layer.

3. The method as claimed in claim 1, wherein the plastic deformation takes place without volume compression and/or in that, during the deformation, the thickness of the second metal layer is reduced at least in certain portions at the raised locations.

4. The method as claimed in claim 1, wherein, with respect to the raised locations, the second metal layer is made thicker than the first metal layer.

5. The method as claimed in claim 1, wherein the second metal layer is applied to the second terminal area and/or in that the first metal layer is applied to the first terminal area and/or in that the second metal layer is applied at least in certain portions to the second contact area and/or in that the first metal layer is applied at least in certain portions to the first contact area.

6. The method as claimed in claim 1, wherein the second metal layer has a degree of volume filling that is between 2% and 95%.

7. The method as claimed in claim 1, wherein the raised locations have a minimum structure size of between 10 µm and 1000 µm and/or in that the second metal layer has on a base area A a relief with an average contour line and the ratio L/A of the overall length L of the average contour line to the base area A is between 1000 m/m$^2$ and 100 000 m/m$^2$.

8. The method as claimed in claim 1, wherein the second metal layer has a degree of volume filling that is between 5% and 50%.

9. The method as claimed in claim 1, wherein the first metal layer comprises one or more of tin, lead, indium and cadmium.

10. The method as claimed in claim 1, wherein the second metal layer consists of indium or tin.

11. The method as claimed in claim 1, wherein the first metal layer consists of indium or tin.

12. The method as claimed in claim 1, wherein a mask is used in order to produce the depressed and raised locations of the second metal layer.

13. The method as claimed in claim 1, wherein the first metal layer is flat.

14. The method as claimed in claim 1, wherein the second terminal area has an uneven, curved surface.

15. A diode laser, comprising:
at least one edge emitting laser comprising:
multiple emitters lying in a line;
a first contact area, which is formed as a p contact; and
a second contact area, which is formed as an n contact and has a normal n and an area content A;
a heat conducting body comprising:
a first terminal area; and a first metal layer arranged between the first terminal area and the first contact area, the first metal layer having a uniform layer thickness of less than 3 µm; and a cover having a second terminal area and a second metal layer, the second metal layer having multiple raised locations and multiple depressed locations in a sectional plane, a thickness at the raised locations being 5 µm to 15 µm, wherein the at least one edge emitting laser is arranged between the heat conducting body and the cover, wherein the second metal layer is arranged at least in certain portions between the second terminal area and the second contact area, wherein the cover is mechanically connected to the heat conducting body, wherein the first contact area is thermally and electrically connected over the surface area to the first terminal area, wherein the second contact area is electrically connected to the second terminal area by means of the second metal layer, wherein the second metal layer has connected locations, at which the second contact area is continuously connected to the second terminal area in the direction of the normal n, and also has interrupted locations, at which, because of voids within the second metal layer, the second contact area is not continuously connected to the second terminal area in the direction of the normal n, wherein the interrupted locations have an overall area that is at least 20% of the area content A, and wherein the voids within the second metal layer are filled with an epoxy resin.

16. The diode laser as claimed in claim 15, wherein the cover is provided as making a contribution to the heat dissipation from the second contact area and/or in that the cover is thermally and mechanically connected to the heat conducting body by means of an electrically insulating joining agent.

17. A method of using a metal layer, the metal layer having been produced with the involvement of a coating process and has a nubbed structure, the nubbed structure having a coverage density with at least one nub per square millimeter of area of the layer, to produce a clamped connection for a diode laser, the method comprising:

arranging a laser bar between a heat conducting body and a cover, the laser bar having curvatures and multiple emitters;

arranging the metal layer between a n-side contact area of the laser bar and a terminal area of the cover, the metal layer being provided on the contact area or on the terminal area, the metal layer having multiple raised locations and multiple depressed locations in a sectional plane, the metal layer being produced by galvanic coating, vapor deposition or sputtering and having a thickness at the raised locations of 5 µm to 15 µm;

arranging another metal layer between a first terminal area of the heat conducting body and a p-side contact area of the laser bar, the another metal layer comprising one or more of tin, lead, indium and cadmium applied to the first contact area and having a uniform thickness of less than 3 µm;

force pressing the cover in the direction of the heat conducting body, whereby curvatures of the at least one laser bar are evened out and the multiple emitters lie in a line; and filling voids within the second metal layer with an epoxy resin.

* * * * *